United States Patent
Danilov et al.

(10) Patent No.: US 10,642,688 B2
(45) Date of Patent: May 5, 2020

(54) SYSTEM AND METHOD FOR RECOVERY OF UNRECOVERABLE DATA WITH ENHANCED ERASURE CODING AND REPLICATION

(71) Applicant: EMC IP Holding Company LLC, Hopkinton, MA (US)

(72) Inventors: Mikhail Danilov, Saint Petersburg (RU); Konstantin Buinov, Prague (CZ)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 89 days.

(21) Appl. No.: 15/952,176

(22) Filed: Apr. 12, 2018

(65) Prior Publication Data

US 2019/0317858 A1 Oct. 17, 2019

(51) Int. Cl.
- *G06F 11/00* (2006.01)
- *G06F 11/10* (2006.01)
- *H03M 13/00* (2006.01)
- *G06F 3/06* (2006.01)
- *H03M 13/15* (2006.01)

(52) U.S. Cl.
CPC .......... *G06F 11/1076* (2013.01); *G06F 3/064* (2013.01); *G06F 3/067* (2013.01); *G06F 3/0619* (2013.01); *H03M 13/154* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 4,726,021 A | 2/1988 | Horiguchi et al. | |
| 5,168,499 A * | 12/1992 | Peterson | G06F 7/02 714/30 |
| 5,383,205 A | 1/1995 | Makihara et al. | |
| 5,768,434 A * | 6/1998 | Ran | H04N 11/042 382/240 |
| 8,417,987 B1 | 4/2013 | Goel et al. | |
| 8,595,692 B2 * | 11/2013 | Kalagananam | G06F 8/458 717/107 |

(Continued)

OTHER PUBLICATIONS

Office Action dated Aug. 1, 2019 for U.S. Appl. No. 15/965,453, 15 pages.

(Continued)

*Primary Examiner* — Daniel F. McMahon
(74) *Attorney, Agent, or Firm* — Amin, Turocy & Watson, LLP

(57) ABSTRACT

In geographically-distributed object storage systems that utilize erasure coding, non-intersecting sub matrices of a great encoding matrix can be utilized to erasure code data fragments of a chunk at the zone level and generate coding fragments. Accordingly, the data fragments that are stored within different zones are identical, while the coding fragments stored within the different zones are disparate. Subsequent to a multi-zone data failure, wherein it is determined that a decoding operation cannot be performed at the zone level, available fragments associated with the chunk can be collected from the zones and collectively decoded to recover the chunk. In one aspect, the fragments can be decoded by utilizing a great decoding matrix that corresponds to the great encoding matrix.

20 Claims, 10 Drawing Sheets

(56) References Cited

U.S. PATENT DOCUMENTS

| | | | |
|---|---|---|---|
| 10,284,234 B1 * | 5/2019 | Danilov | H03M 13/373 |
| 2005/0278612 A1 | 12/2005 | Edirisooriya | |
| 2006/0282716 A1 | 12/2006 | Pomerantz | |
| 2007/0006019 A1 | 1/2007 | Chien | |
| 2008/0115017 A1 | 5/2008 | Jacobson | |
| 2009/0083504 A1 | 3/2009 | Belluomini et al. | |
| 2009/0106583 A1 | 4/2009 | Kawamura | |
| 2012/0284589 A1 | 11/2012 | Kim et al. | |
| 2013/0173996 A1 * | 7/2013 | Anderson | H03M 13/3761 |
| | | | 714/770 |
| 2013/0227054 A1 * | 8/2013 | Zhang | G06Q 30/06 |
| | | | 709/217 |
| 2015/0249470 A1 | 9/2015 | Roth et al. | |

OTHER PUBLICATIONS

Notice of Allowance dated Dec. 4, 2019 for U.S. Appl. No. 15/965,453, 36 pages.

Li et al. "Preventing Silent Data Corruptions from Propagating During Data Reconstruction", IEEE Transactions on Computers, vol. 59, Issue 12, Dec. 2010, pp. 1611-1624.

\* cited by examiner

SYSTEM AND METHOD FOR RECOVERY OF UNRECOVERABLE DATA WITH ENHANCED ERASURE CODING AND REPLICATION

TECHNICAL FIELD

The subject disclosure relates generally to distributed erasure coding. More specifically, this disclosure relates to a system and method for recovery of unrecoverable data with enhanced erasure coding and replication.

BACKGROUND

The large increase in amount of data generated by digital systems has created a new set of challenges for data storage environments. Traditional storage area network (SAN) and/or network-attached storage (NAS) architectures have not been designed to support data storage and/or protection at large multi-petabyte capacity levels. Object storage technology can be utilized to meet these requirements. By utilizing object storage technology, organizations can not only keep up with rising capacity levels, but can also store these new capacity levels at a manageable cost point.

Typically, a scale-out, cluster-based, shared-nothing object storage that employs a microservices architecture pattern, for example, an Elastic Cloud Storage (ECS) can be utilized as a storage environment for a new generation of workloads. ECS utilizes the latest trends in software architecture and development to achieve increased availability, capacity use efficiency, and performance. ECS uses a specific method for disk capacity management, wherein disk space is partitioned into a set of blocks of fixed size called chunks. User data is stored in these chunks and the chunks are shared. One chunk can comprise fragments of several user objects. Chunk content is modified in an append mode. When chunks become full, they are sealed and the content of sealed chunks is immutable.

A corresponding feature of ECS supports geographically distributed setups (GEO) comprising two or more zones. When three or more zones are employed, each zone can receive chunks from other zones and the zones can then combine the chunks. This type of cluster-based storage of several racks supports cluster nodes that communicate with each other. In some cases, one cluster can be located within a local data center and another cluster can be located within a remote data center. Although the geographically distributed setups can be used to provide an additional protection of user data by means of replication, the replication mechanism works at the chunks level.

The above-described background relating to ECS is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Example systems and methods, and other embodiments, disclosed herein relate to facilitating enhanced data recovery in distributed storage systems. In one example embodiment, a system is disclosed that comprises a processor and a memory that stores executable instructions that, when executed by the processor, facilitate performance of operations. Moreover, the operations comprise determining a coding matrix that is to be employed to erasure code a chunk stored within a distributed storage system and determining non-intersecting sub matrices of the coding matrix. Further, the operations comprise encoding data fragments of the chunk by utilizing the non-intersecting sub matrices, wherein the encoding results in a generation of different coding fragments that are to be stored within respective zones of the distributed storage system. Furthermore, operations comprise decoding, based on a decoding matrix that corresponds to the coding matrix, the fragments that are available after a multi-zone data failure, wherein the decoding results in a recovery of the data fragments.

Another example embodiment of the specification relates to a method that comprises configuring, by a system comprising a processor, a coding matrix that is to be employed during an erasure coding of a chunk stored within a distributed storage system; determining first coding fragments based on encoding data fragments of the chunk in accordance with a first sub matrix of the coding matrix, wherein the first coding fragments are to be stored within a first zone of the distributed storage system; and determining second coding fragments based on encoding the data fragments in accordance with a second sub matrix of the coding matrix, wherein the first sub matrix and the second sub matrix are non-intersecting matrices, and wherein the second coding fragments are to be stored within a second zone of the distributed storage system.

Another example embodiment of the specification relates to a computer-readable storage medium comprising instructions that, in response to execution, cause a computing node device comprising a processor to perform operations, comprising configuring a coding matrix that is to be employed to erasure code a chunk stored within a distributed storage system; encoding data fragments of the chunk in accordance with a first sub matrix of the coding matrix to generate first coding fragments that are to be stored within a first zone of the distributed storage system; and encoding the data fragments in accordance with a second sub matrix of the coding matrix to generate second coding fragments that are to be stored within a second zone of the distributed storage system, wherein the first sub matrix and the second sub matrix are non-intersecting matrices.

The following description and the drawings set forth certain illustrative aspects of the specification. These aspects are indicative, however, of but a few of the various ways in which the principles of the specification may be employed. Other advantages and novel features of the specification will become apparent from the detailed description of the specification when considered in conjunction with the drawings.

DETAILED DESCRIPTION

Figure 1:
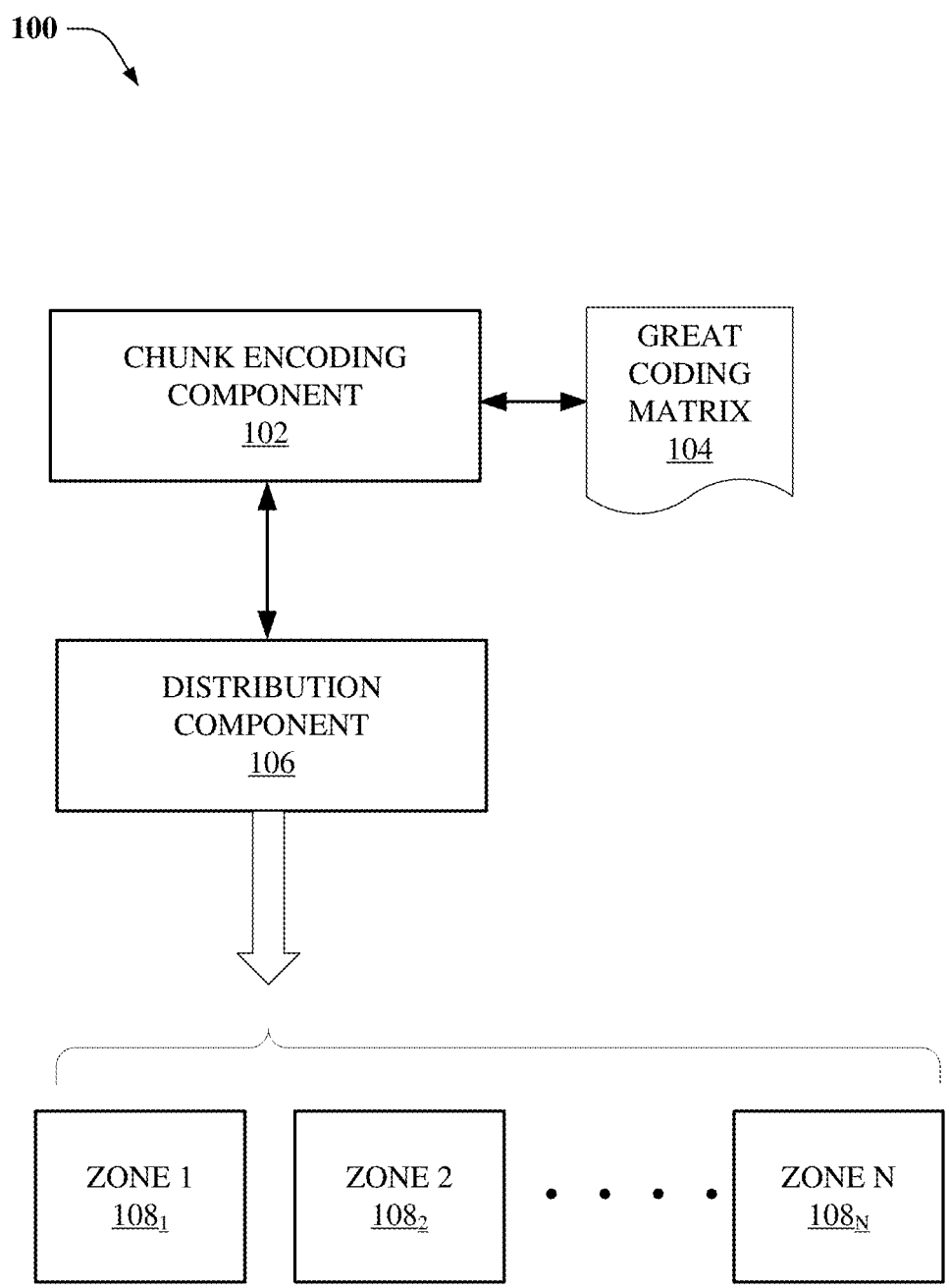
FIG. 1 illustrates an example system for encoding and distribution of erasure-coded fragments of a chunk to facilitate enhanced data recovery.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed object storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to an elastic cloud storage (ECS) platform that can combine the cost advantages of commodity infrastructure with the reliability, availability and serviceability of traditional arrays. In one aspect, the ECS platform can comprise a cluster of nodes (also referred to as "cluster" herein) that delivers scalable and simple public cloud services with the reliability and/or control of a private-cloud infrastructure. Moreover, the ECS platform comprises a scale-out, cluster-based, shared-nothing object storage, which employs a microservices architecture pattern. The ECS platform can support storage, manipulation, and/or analysis of unstructured data on a massive scale on commodity hardware. As an example, ECS can support mobile, cloud, big data, and/or social networking applications. ECS can be deployed as a turnkey storage appliance or as a software product that can be installed on a set of qualified commodity servers and/or disks. The ECS scale-out and geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc. In an aspect, ECS does not rely on a file system for disk capacity management. Instead, ECS partitions disk space into a set of blocks of fixed size called chunks (e.g., having a chunk size of 128 MB). All user data is stored in these chunks and the chunks are shared. Typically, a chunk can comprise fragments of several different user objects. The chunk content can be modified in append-only mode. When a chunk becomes full, it can be sealed and content of a sealed chunk is immutable.

ECS does not employ traditional data protection schemes like mirroring or parity protection. Instead, ECS utilizes erasure coding for data protection. Although the systems and methods disclosed herein have been described with respect to object storage systems (e.g., ECS), it is noted that the subject specification is not limited to object storage systems and can be utilized for most any geo-distributed storage systems that utilize erasure coding for data protection.

Erasure coding was created as a forward error correction method for a binary erasure channel. However, erasure coding can be used for data protection on data storages. During erasure coding, a piece of data can be divided into k data fragments of equal size. During encoding, redundant m coding fragments are created so that the system can tolerate the loss of any m fragments. The process of generating the coding fragments is called encoding. The process of data fragments recovery using available data and coding fragments is called decoding.

If a distributed storage is to tolerate the loss of any m zones/clusters/chunks, then erasure coding can begin at each zone by replicating each new chunk to at least m remote zones (e.g., m is most any integer greater than 1). As a result, there are m backup copies of each chunk. Typically, there is one primary backup copy, which can be utilized for encoding. Encoding is performed by one zone for primary backup chunks and other zones replicate to it. Once a zone has k primary chunks replicated from different remote zones, the zone can perform encoding using the chunks replicated to it as data fragments (e.g., wherein k is most any integer, typically greater than 1). The chunk size is fixed, in ECS, with padding or other data to complement, wherein the other data is added as needed. The result of encoding is m data portions of a chunk size. They are stored as chunks of a specific type called coding chunks. After encoding is complete, the zone can store one coding chunk locally and move other m−1 coding chunks to remote zones making sure all the k+m data and coding chunks are stored at different zones whenever possible. Afterwards, the primary backup chunks used for encoding and their peer backup chunks at other zones can be deleted. It is noted that the term "zone" as used herein can refer to one or more clusters that is/are independently operated and/or managed. Different zones can be deployed within the same location (e.g., within the same data center) or at different geographical locations (e.g., within different data centers).

In a geographically distributed data storage system, a chunk from a first zone (e.g., frontend storage device) can be replicated to a second zone (e.g., backend storage device). During a failure condition (e.g., hardware failure and/or disk corruption, natural disaster (e.g., flood zone, earthquake zone, hurricane, etc.), accident/attack (e.g., malicious attack), etc.), the chunk can be unavailable within the first zone and can be recovered using its backup copy. This process is called GEO recovery. It is noted that when a chunk is termed as unavailable, it can be completely lost and/or a portion of its fragments can be lost and the remaining portion of available fragments (n) are not enough to perform a local decoding operation (n<k) within the first zone. Typically, GEO recovery requires availability of at least one chunk copy. However, it is possible to have all chunk copies unavailable. The probability of such an event is higher when two or more zones/clusters are deployed to one data center. In ECS, unavailability of a single chunk with user data can impact thousands of user objects. The systems and methods disclosed herein provide an enhanced data recovery technique that can leverage the power of erasure coding and replication combination to support the case when all chunk copies are unavailable.

Referring initially to FIG. 1, there illustrated is an example system 100 for encoding and distribution of erasure-coded fragments of a chunk to facilitate enhanced data recovery. As an example, system 100 can comprise one or more nodes within a zone of an object storage system such as, but not limited to, Dell EMC® Elastic Cloud Storage (ECS™) In one aspect, system 100 can employ erasure coding to help provide enhanced data durability without the overhead of storing multiple copies of the data. However, this does not protect against site failures/outages. Geo-replication provides enhanced protection against site failures by having multiple copies of the data, for example, a primary copy of the data at the original site and a secondary copy of the data at a remote site and/or virtual data center (VDC). Both the primary and replicated copies of data at other sites are individually protected via erasure coding or triple-mirrored chunks. This means each copy has protection from local failures, such as disk or node failure.

In the embodiment shown in FIG. 1, a chunk encoding component 102 can perform erasure coding to encode data fragments of a data chunk. As an example, the encoding operation can be represented with the equation below:

$$C_i = \Sigma_{j=1}^{k} C_{i,j} \quad (1)$$

wherein, $$C_{i,j} = X_{i,j} * D_j \quad (2)$$

and wherein, $X_{i,j}$ is a defined coefficient from a coding matrix (e.g., wherein i, j, and/or k can be most any integer). Further, $D_j$ are independent data fragments and $C_i$ are coding fragments. All data/coding fragments united in one protection set are stored in different zones. In conventional systems, the same coding fragments are stored within all the different zones (e.g., since the same coding matrix is utilized to generate the coding chunks). In contrast, chunk encoding component 102 utilizes non-intersecting subsets of a great coding matrix to generate different coding fragments for each of the different zones.

In one aspect, for a zone that uses a protection scheme and/or protocol, k+m, and wherein a number of zones in a geographically distributed system is N (wherein N is an integer greater than 1), a great coding matrix 104 (and corresponding decoding matrix) having a size mN×k can be generated (e.g., by a node of the geographically distributed system). N non-intersecting sub-matrices of the great matrix (m×k each) can be determined (e.g., by the chunk encoding component 102) and a distribution component 106 can distribute the N non-intersecting sub-matrices between the N zones $108_1$-$108_N$. Then, each zone can utilize the same protection scheme k+m, but different coding fragments for the same data portion (e.g. data chunk) because coding matrices utilized by each of zone $108_1$-$108_N$ are different. It is noted that the coding fragments from the different zones $108_1$-$108_N$ are still united by the math that stands behind the great coding matrix 104.

For example, if N=2, there are two zones and the erasure coding (EC) protection scheme (also referred to herein as EC protection protocol) used at the zone level is 4+2 (k+m, k=4 and m=2). Then in this example scenario, the great coding matrix 104 can have a size of (2×2)×4 or simply 4×4. An example great matrix CM can be as below:

$$CM = \begin{vmatrix} X_{1,1} & X_{1,2} & X_{1,3} & X_{1,4} \\ X_{2,1} & X_{2,2} & X_{2,3} & X_{2,4} \\ X_{3,1} & X_{3,2} & X_{3,3} & X_{3,4} \\ X_{4,1} & X_{4,2} & X_{4,3} & X_{4,4} \end{vmatrix} \quad (3)$$

According to an aspect, the two non-intersecting sub matrices (one for each zone) can be selected in most any manner. For example, the sub matrix ($CM^1$) to be used by Zone 1 can be:

$$CM^1 = \begin{vmatrix} X_{1,1}^1 & X_{1,2}^1 & X_{1,3}^1 & X_{1,4}^1 \\ X_{2,1}^1 & X_{2,2}^1 & X_{2,3}^1 & X_{2,4}^1 \end{vmatrix} \quad (4)$$

Further, the sub matrix ($CM^2$) to be used by Zone 2 can be:

$$CM^2 = \begin{vmatrix} X_{1,1}^2 & X_{1,2}^2 & X_{1,3}^2 & X_{1,4}^2 \\ X_{2,1}^2 & X_{2,2}^2 & X_{2,3}^2 & X_{2,4}^2 \end{vmatrix} \quad (5)$$

Wherein, $$X_{i,j}^1 = X_{i,j} \quad (6)$$

and $$X_{i,j}^2 = X_{i+2,j} \quad (7)$$

It is noted that the zones $108_1$-$108_N$ can store data fragments and respective coding fragments within one or more storage nodes comprising volatile memory(s) or nonvolatile memory(s), or both volatile and nonvolatile memory(s). Examples of suitable types of volatile and non-volatile memory are described below with reference to FIG. 10. The memory (e.g., data stores, databases) of the subject systems and methods is intended to comprise, without being limited to, these and any other suitable types of memory.

Figure 2:
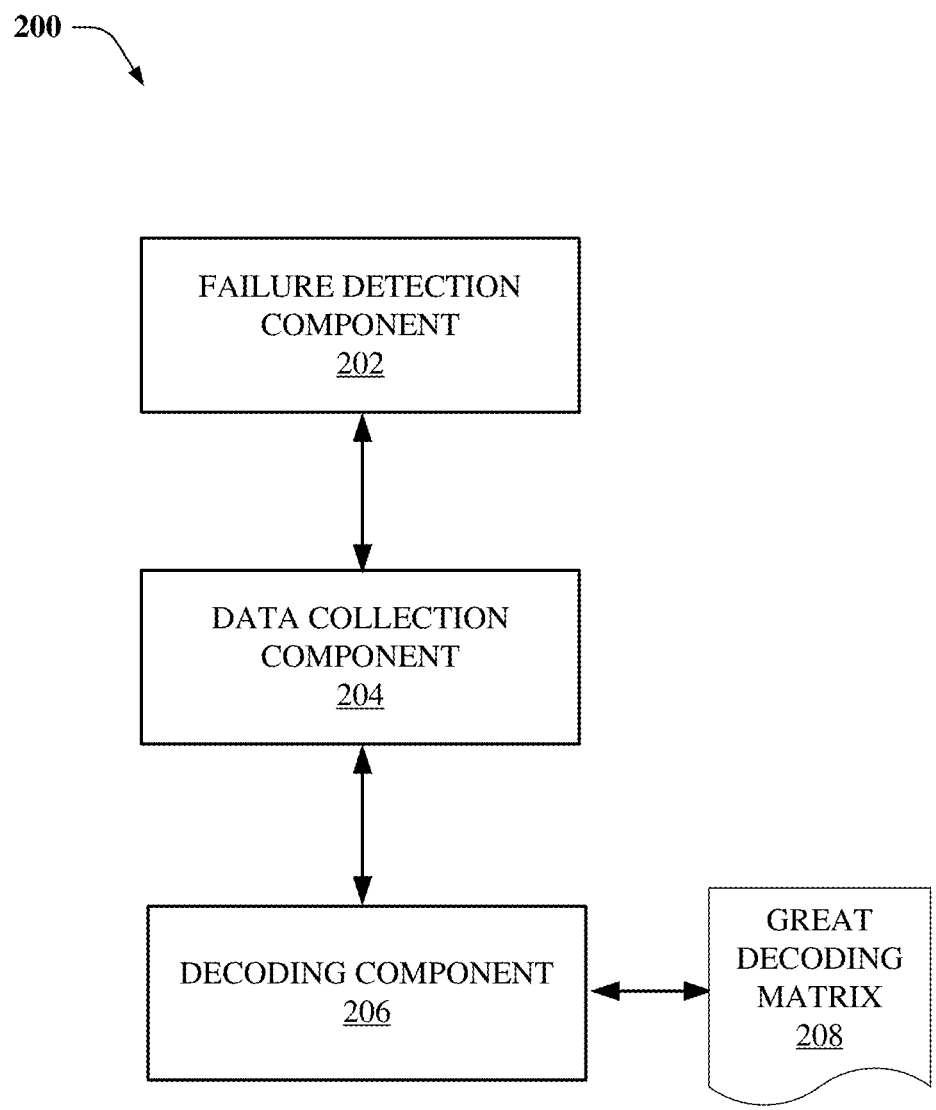
FIG. 2 illustrates an example system for enhanced data recovery in accordance with an aspect of this disclosure.

FIG. 2 illustrates an example system 200 for enhanced data recovery in accordance with an aspect of this disclosure. As an example, system 200 can comprise one or more nodes within a zone of an object storage system such as, but not limited to, Dell EMC® ECS™. In the embodiment shown in FIG. 1, a chunk encoding component 102 can perform erasure coding to encode data fragments of a data chunk.

In one aspect, a failure detection component 202 can determine that a failure condition has occurred. For example, a failure condition can comprise a loss of data (e.g., one or more data and/or coding fragments) due to data corruption, hardware failures, and/or data center disasters. Typically, if chunk has been stored within a primary zone by employing a k+m erasure coding protection scheme and if less than "m" fragments are lost, data can be recovered locally by the primary using a decoding operation (e.g., without inter-zone communication). If more than "m" fragments are lost within the primary zone, standard GEO recovery can be utilized and backed-up data from a secondary zone(s) can be utilized for data recovery. However, in some scenarios, data can be lost at both the primary zone and the secondary zone(s). In such a scenario, the failure detection component 202 can determine whether all copies of the chunk (e.g., stored within the primary zone and the secondary zone(s)) are unavailable. If determined that all copies of the chunk are unavailable, a data collection component 204 can collect the available data and coding fragments of the chunk from all the zones (e.g. zones $108_1$-$108_N$). It is noted that data fragments from different zones with the same index are identical. On the contrary, coding fragments from different zones with the same index are different since different sub matrices are utilized to generate coding fragments at each zone. Therefore, all available coding fragments from all zones are collected.

With enhanced GEO recovery, the chunk can be recovered if the total number of available data and coding fragments is greater than or equals to k. In an aspect, a decoding component 206 can perform data recovery is done via a decoding operation. A great decoding matrix 208 (that corresponds to the great coding matrix 104) is utilized for the decoding operation. During decoding, data fragment(s) can retain their indices. However, the indices of coding fragments are changed in accordance with the way the great coding matrix was split. After successful decoding, all data fragments and, thus the data portion itself, are available again and the recovery process is completed. In one example, the decoding component 206 can store the data fragments within one or more of the zones $108_1$-$108_N$ and the chunk encoding component 102 can perform an encoding operation to erasure code the data fragments.

Figure 3:
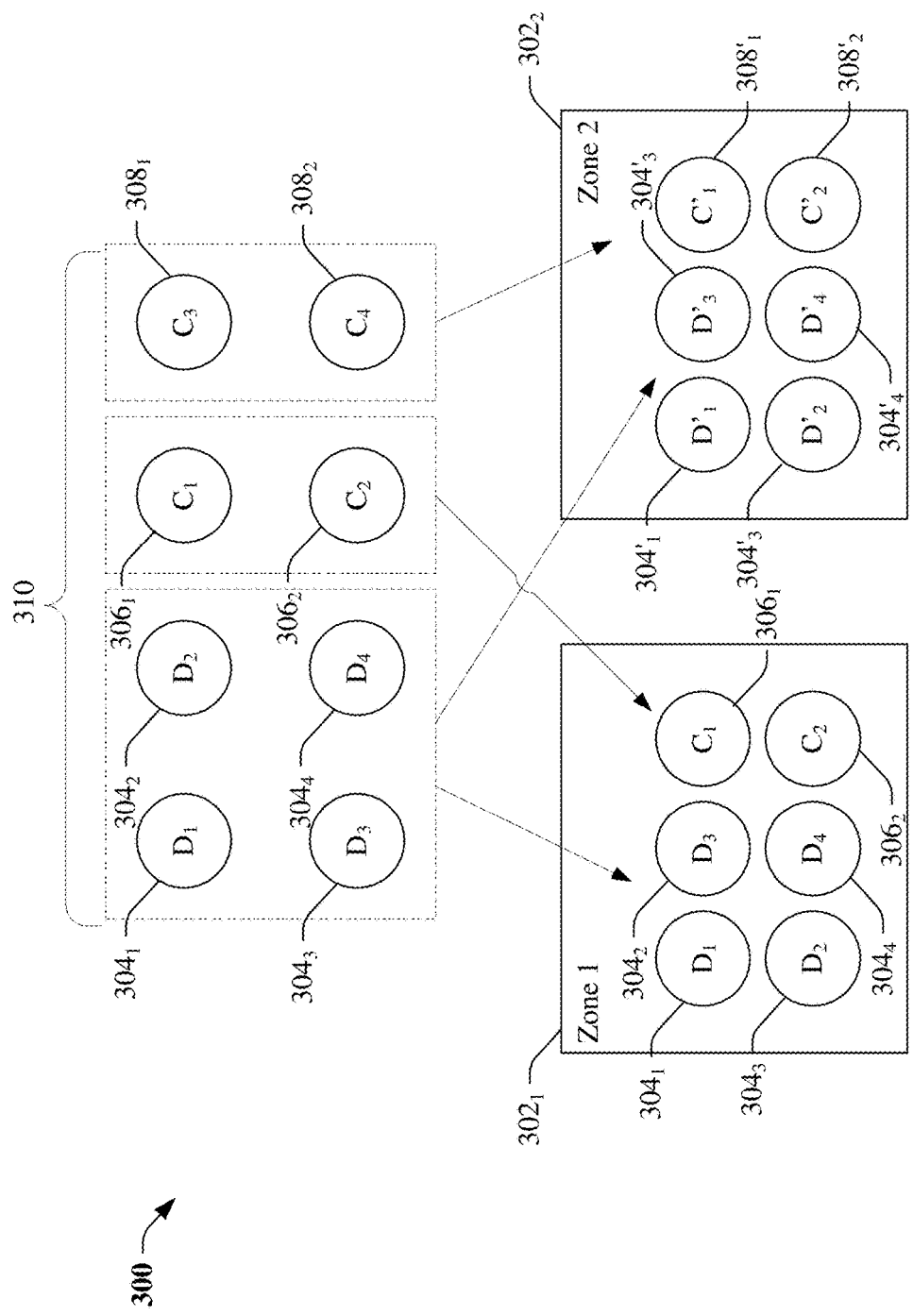
FIG. 3 illustrates an example system with fragments that are protected with erasure coding.

Referring now to FIG. 3, there is illustrated an example system 300 comprising four data fragments protected with erasure coding. System 300 comprises two zones, zone 1 $302_1$ and zone 2 $302_2$. As an example, the zones 1-2 can be independently operated/managed clusters that are linked via an inter-zone network (e.g., a wide area network (WAN)) to bi-directionally replicate data among the zones. The geo-replication ensures that the data is protected against site failures and disasters. Although FIG. 3 depicts only two zones (e.g., zone 1 $302_1$ and zone 2 $302_2$), it is noted that the subject system is not limited to two zones and most any number of zones can be utilized for replication.

In one example, a 4+2 (k=4 and m=2) erasure coding protection scheme can be utilized to encode a chunk of data at a zone level. Accordingly, each chunk copy (stored within zone 1 $302_1$ and zone 2 $302_2$) can be represented as a set of four data fragments and two coding fragments. In one aspect, the chunk encoding component 102 can encode data fragments D1-D4 ($304_1$-$304_4$) by utilizing different non-intersecting subsets of the great coding matrix 104, to generate two different sets of coding fragments, for example, C1-C2 ($306_1$-$306_2$) and C3-C4 ($308_1$-$308_2$). As shown in FIG. 3, fragments of a great protected chunk 310 are distributed between the two zones (e.g., zone 1 $302_1$ and zone 2 $302_2$). The great protected chunk 310 comprises four data fragments D1-D4 ($304_1$-$304_4$) and four coding fragments C1-C2 ($306_1$-$306_2$) and C3-C4 ($308_1$-$308_2$). A primary copy of the four data fragments D1-D4 ($304_1$-$304_4$) is stored within zone 1 $302_1$ and a secondary copy of the four data fragments D1-D4 ($304_1$-$304_4$), that is denoted as D'1-D'4 ($304'_1$-$304'_4$), is stored within zone 2 $302_2$. Further, coding fragments C1-C2 ($306_1$-$306_2$) are stored within zone 1 $302_1$ and coding fragments C3-C4 ($308_1$-$308_2$) are stored within zone 2 $302_2$ (denoted as C'1-C'2 ($308'_1$-$308'_2$)). Moreover, the data fragments stored in the different zones are identical, while the coding fragments stored within the different zones are not identical. Typically, zone 1 $302_1$ and zone 2 $302_2$ can be substantially similar to zones $108_1$-$108_N$ and can include functionality as more fully described herein, for example, as described above with regard to zones $108_1$-$108_N$.

Figure 4:
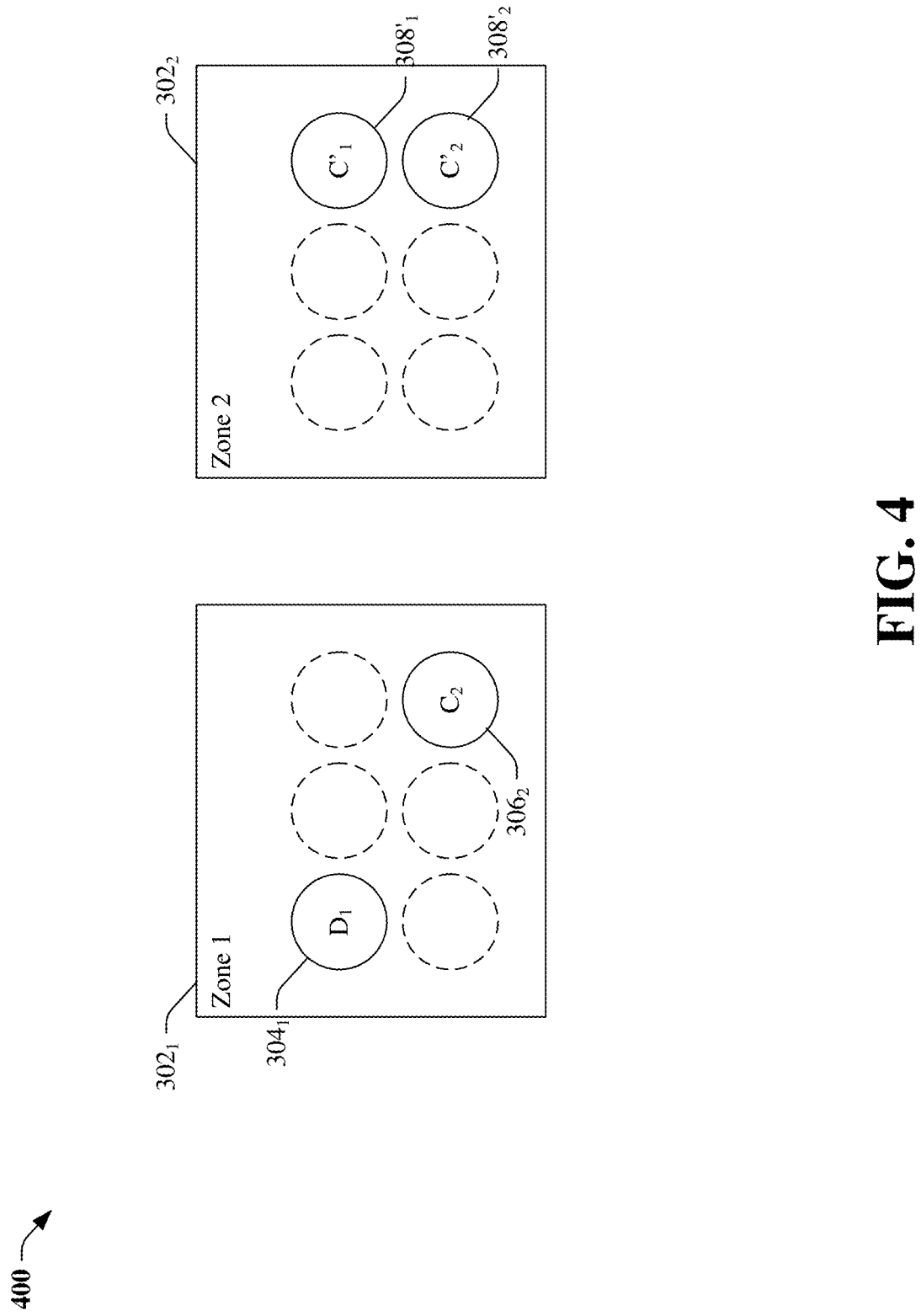
FIG. 4 illustrates an example system that has unavailable copies of a data chunk across different zones.
Figure 5:
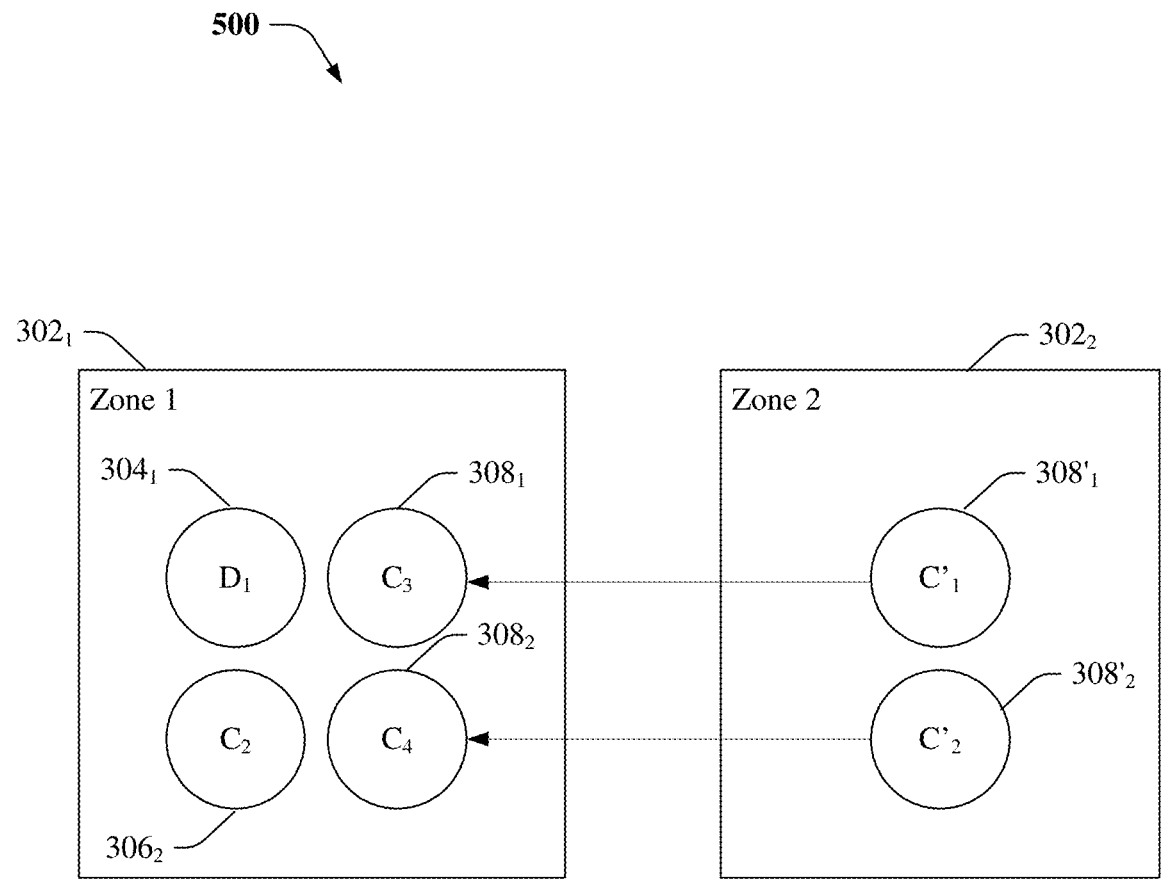
FIG. 5 illustrates an example system for collecting available fragments after a failure condition has occurred.
Figure 6:
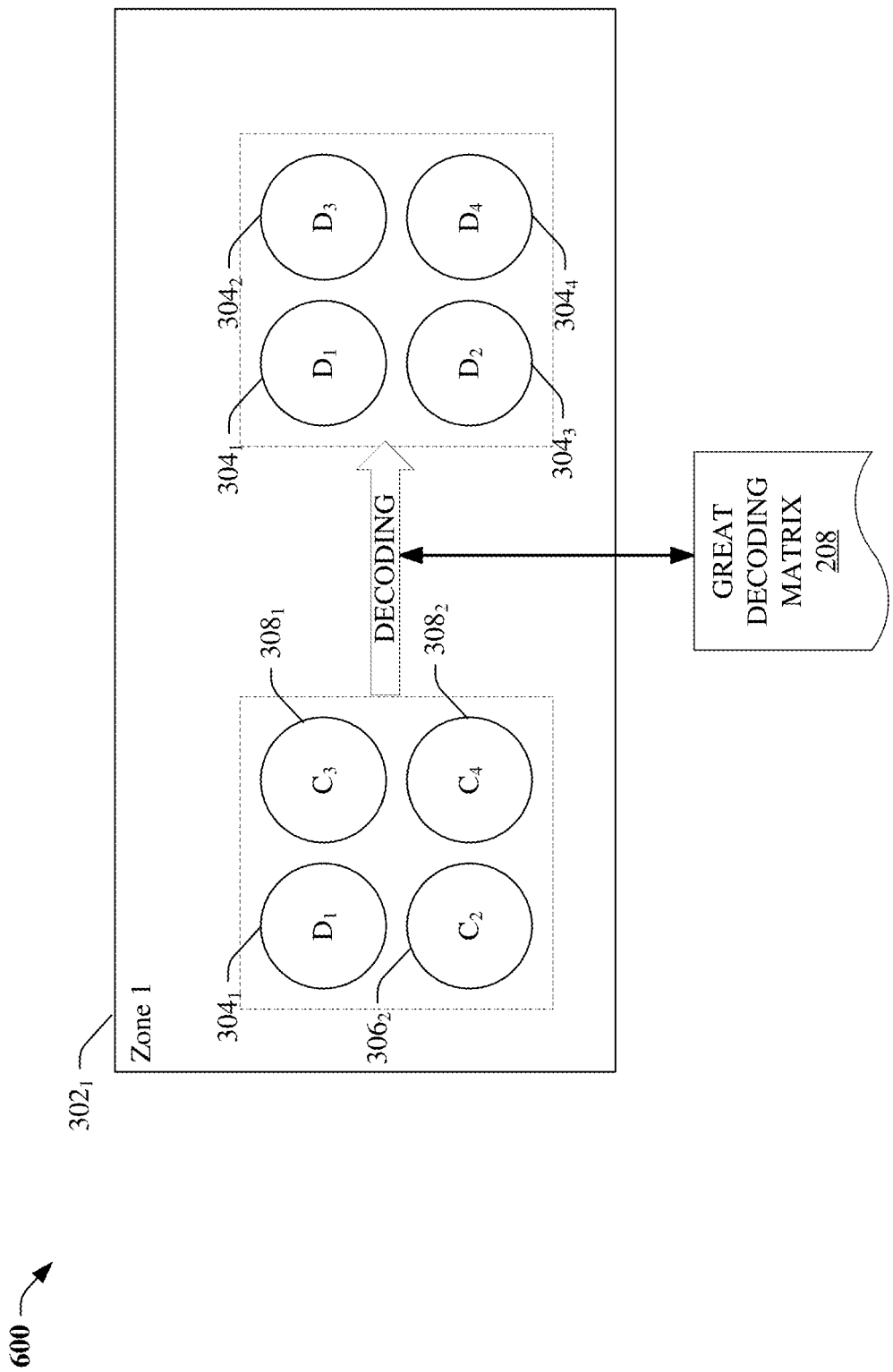
FIG. 6 illustrates an example system for recovery of data after a failure condition has occurred.

FIGS. 4-6 depict an example enhanced GEO recovery operation. Referring now to FIG. 4, there illustrated is an example system 400 that has two unavailable copies of a data chunk. System 400 depicts a loss of fragments in both zone 1 $302_1$ and zone 2 $302_2$. As an example, the loss of fragments can occur due to most any failure condition, such as, but not limited to a power jump and/or power cut that causes multiple hardware failures. In this example, eight fragments of the total twelve fragments are lost. All the chunk copies, are unrecoverable by using conventional local decoding and, therefore, determined to be unavailable (e.g., by the failure detection component 202). Moreover, each chunk copy needs at least four fragments to locally perform decoding (e.g., without transferring data between the zones). However, since both zone 1 $302_1$ and zone 2 $302_2$ have only two fragments available, the system is unrecoverable using the conventional recovery methods. It is noted that system 400 depicts data loss of example fragments and that the subject specification can be applicable for a data loss of most any combination of data and/or coding fragments within the different zones.

The systems and methods disclosed herein utilize enhanced GEO recovery, wherein non-intersecting subsets of a great coding matrix have been utilized to generate different coding fragments for each zone. In one aspect, for a k+m erasure coding protection scheme, a m×k coding matrix is utilized to produce m coding fragments from k data fragments. Any sub-matrix l×k of the matrix m×k (where l<m) is a proper coding matrix for a protection scheme k+l. This can be leveraged to enhance ability of distributed storage systems to recover data after multiple failures.

FIG. 5 illustrates a system 500 for collecting available fragments after a failure condition has occurred. In this example, zone 1 $302_1$ can receive (e.g., via data collection component 204) available fragments, for example, coding fragments as C'1-C'2 ($308'_1$-$308'_2$) from zone 2 $302_2$ via an inter-zone network. The indices of coding fragments C'1-C'2 ($308'_1$-$308'_2$) are transformed to coding fragments C3-C4 ($308_1$-$308_2$) of the great protected chunk. Accordingly, four unique fragments available in zone 1 $302_1$ and can be utilized for recovery via decoding.

FIG. 6 illustrates a system 600 for recovery of data after a failure condition has occurred. In this example, subsequent to collecting the available fragments, zone 1 $302_1$ can perform a decoding operation (e.g., via the decoding component 206). As an example, decoding is an inverse operation for the above described distributed encoding operation. In one aspect, a great decoding matrix (e.g., the great decoding matrix 208) can be utilized for decoding that is different from the coding matrix utilized to encode the chunk. For example, the coefficients in the coding and decoding matrices can be different.

After decoding the content of the chunk, D1-D4 ($304_1$-$304_4$) is available again. In one aspect, the chunk can be re-protected at the zone level (e.g., via the chunk encoding component 102), stored within zone 1 $302_1$ and can be replicated to zone 2 $302_2$ (or another zone) once again. It is noted that the subject specification is not limited to zone 1

302₁ performing the data collection and/or enhanced GEO decoding operation and that most any other zone, including zone 2 302₂, can be utilized to perform data collection and/or enhanced GEO decoding.

Figure 7:
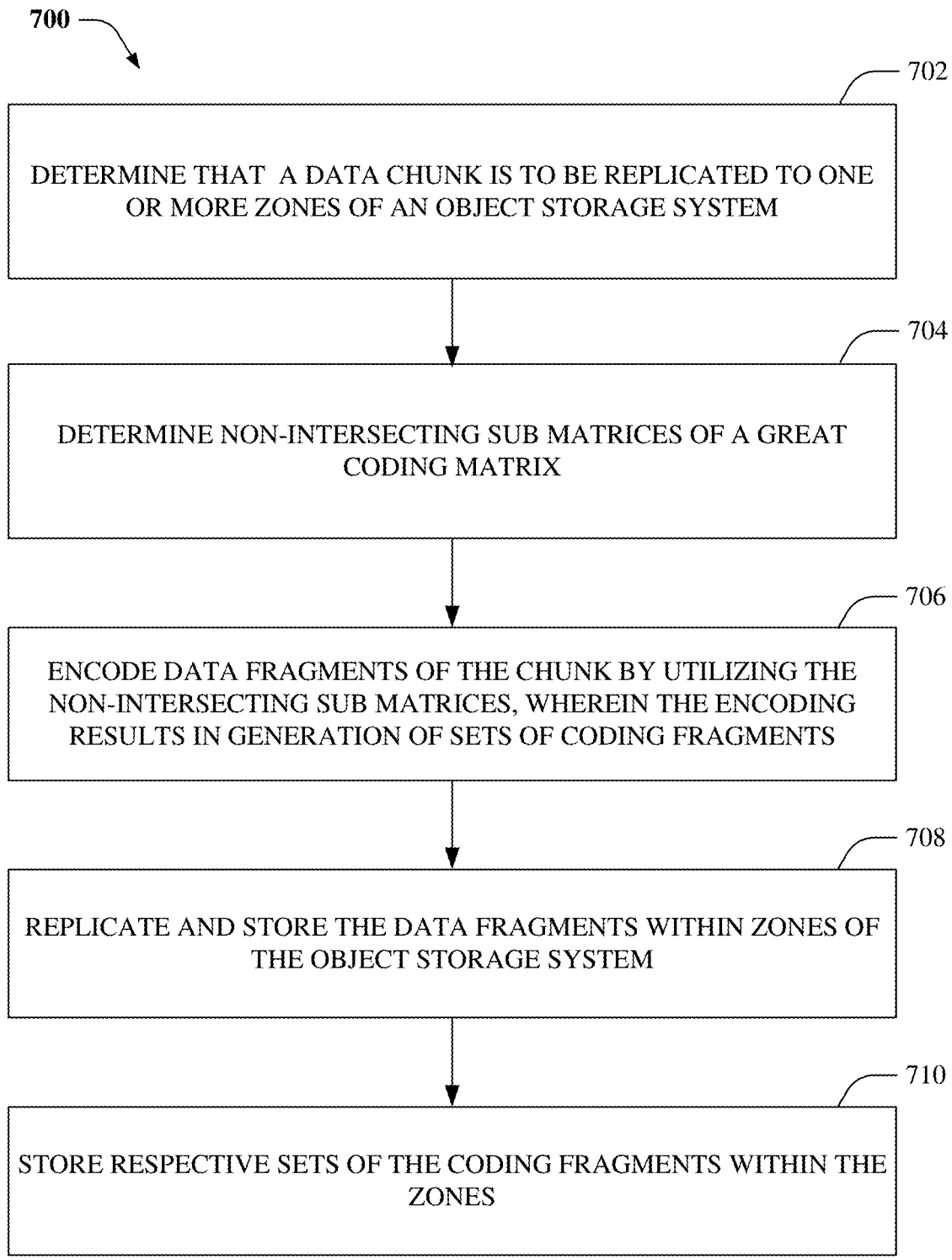
FIG. 7 illustrates an example method for encoding and replicating chunks for enhanced data recovery.
Figure 8:
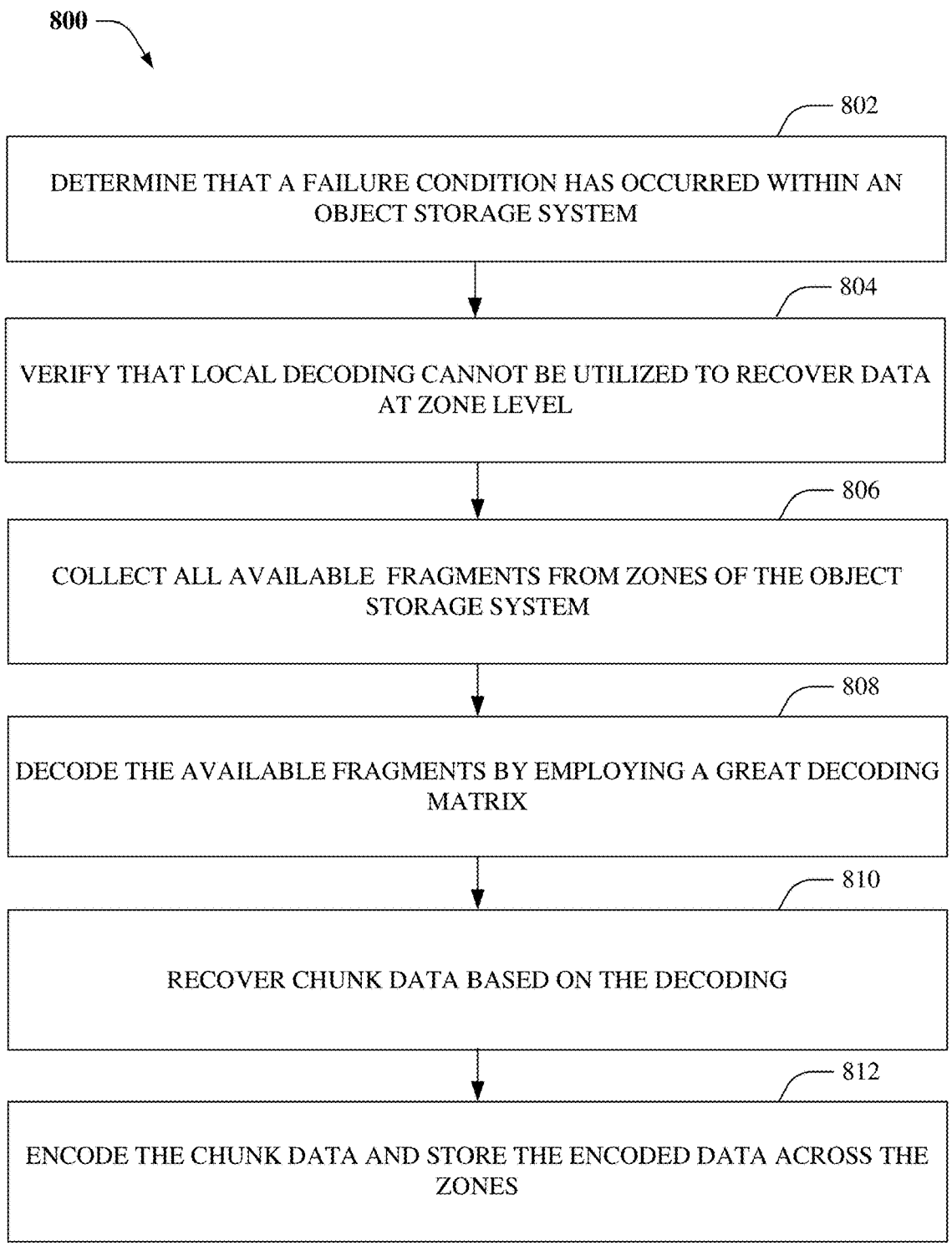
FIG. 8 illustrates an example method for enhanced data recovery in accordance with an aspect of this disclosure.

FIGS. 7-8 illustrate flow diagrams and/or methods in accordance with the disclosed subject matter. For simplicity of explanation, the flow diagrams and/or methods are depicted and described as a series of acts. It is to be understood and appreciated that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Referring now to FIG. 7, there illustrated is an example method 700 for encoding and replicating chunks for enhanced GEO recovery. In an aspect, method 700 can be performed within an object storage system, for example, ECS. Typically, the object storage system employs a method for disk capacity management, wherein the disk space is partitioned into a set of blocks of fixed size (e.g., 128 MB) called chunks. All user data can be stored in the chunks and the chunks can be shared between different users. For example, a chunk can comprise fragments of several dozens of user objects. However, one chunk can also comprise fragments of thousands of user objects (e.g., in case of email archives). Chunk content can be modified in append-only mode. When a chunk becomes full enough, it can be sealed and once sealed, the content of the chunk is immutable. Further, the object storage system can support geographically distributed setups (e.g., GEO) comprising two or more zones. GEO can be used to provide an additional protection of user data by means of replication. At 702, it can be determined that the data chunk is to be replicated to one or more zones.

At 704, non-intersecting sub matrices can be determined from a great coding matrix. For example, the number of sub matrices that the great coding matrix is divided into can be equal to the number of zones wherein copies of the chunk are to be stored. In one aspect, the great coding matrix can be of size mN×k (wherein, k+m is the zone-level erasure protection scheme and N is the number of zones) and each sub matrix can be of size m×k. It is noted that the great coding matrix can be split into the sub matrices in most any manner.

At 706, data fragments of the chunk can be encoded by utilizing the sub matrices and sets of coding fragments can be generated. It is noted that since the sub matrices are non-intersecting and comprise different coefficients, the coding fragments in each set are different. At 708, the data fragments can be replicated and a copy of the data fragments can be stored within each of the zones. Further, at 710, respective sets of coding fragments can be stored within each of the zones. It is noted that the data fragments stored in each zone are identical, while the coding fragments stored in each zone are disparate. In this example scenario, if during a failure condition, the number of fragments (n) that are available (not lost) is not less than k, lost fragments can be received by zone-level decoding (e.g., utilizing a decoding sub matrix corresponding to the coding sub matrix employed by the zone and without transmitting data between zones). In another example scenario, if n<k and fragments are within other zones are not lost, then standard GEO recovery can be utilized. In yet another example scenario, if n<k and fragments are within other zones are also lost, enhanced GEO recovery disclosed herein can be utilized wherein the decoding is performed by utilizing a great decoding matrix corresponding with the great coding matrix.

FIG. 8 illustrates is an example method 800 for enhanced GEO data recovery in accordance with an aspect of this disclosure. At 802 it can be determined that a failure condition has occurred within an object storage system (e.g., ECS), wherein one or more fragments have become corrupted, unavailable, and/or lost. At 804, it can be verified that local decoding cannot be utilized to recover data at the zone level. For example, it can be determined that the number of fragments lost exceeds a defined threshold, such that zone-level decoding is not possible with the available fragments.

During an encoding process, the data fragments of a chunk can be replicated to different zones of the object storage system, wherein each zone can store coding fragments that are determined based on respective sub matrices of a great encoding matrix. At 806, all available fragments can be collected from the zones. At 808, the available fragments can be decoded by employing a great decoding matrix that corresponds to the great encoding matrix. At 810, based on the decoding, the chunk data can be recovered. Additionally, or optionally, at 812, the chunk data can be encoded and stored across the zones.

The systems and methods (e.g., 100-800) disclosed herein provide at least the following non-limiting advantages: (i) an increase in data availability without any run-time overheads (e.g., since the manipulations with matrices can be performed during deployment and configuring of the geographically distributed storage system); (ii) an increase in a number of fragments that the system can lose without data loss and without any additional capacity overheads (e.g., the number can be increased by N (number of zones)).

Figure 9:
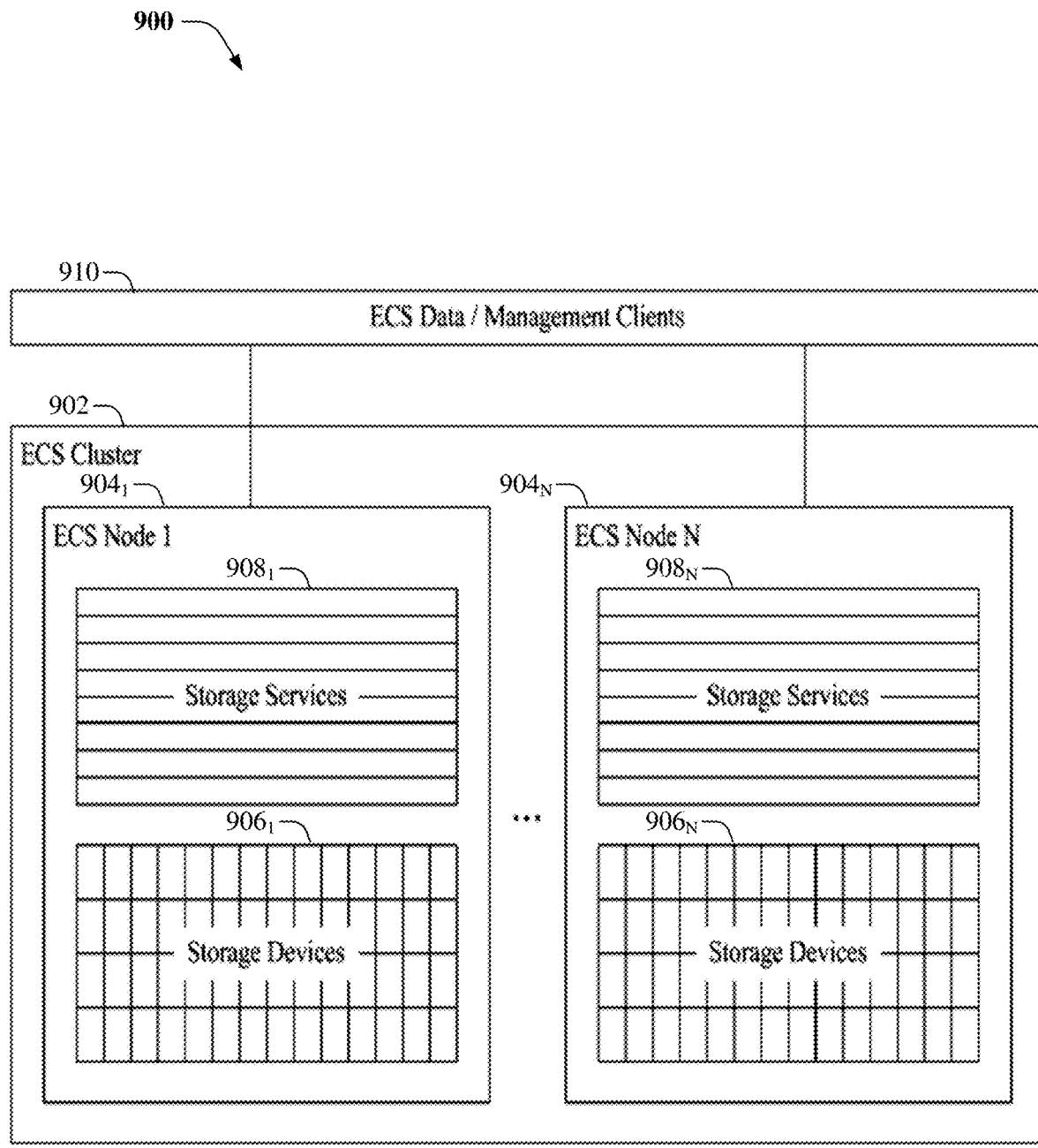
FIG. 9 illustrates high-level architecture of an Elastic Cloud Storage (ECS) cluster that facilitates enhanced data recovery.

FIG. 9 illustrates an example high-level architecture 900 of an ECS cluster, according to an aspect of the subject disclosure. ECS can comprise a software-defined, cloud-scale, object storage platform that combines the cost advantages of commodity infrastructure with the reliability, availability and serviceability of traditional arrays. With ECS, an organization can deliver scalable and simple public cloud services with the reliability and control of a private-cloud infrastructure. ECS provides comprehensive protocol support for unstructured (object and/or file) workloads on a single, cloud-scale storage platform. In an aspect, the ECS cluster 902 can comprise multiple nodes $904_1$-$904_N$, wherein N is most any integer. It is noted that the zones $108_1$-$108_N$, zone 1 $302_1$, and/or zone 2 $302_2$, can comprise at least a portion of ECS cluster 902. The nodes $904_1$-$904_N$ can comprise storage devices (e.g. hard drives) $906_1$-$906_N$ and can run a set of services $908_1$-$908_N$. For example, single node that runs ECS version 3.0 can manage 20 independent services. Further, ECS data/management clients 910 can be coupled to the nodes $904_1$-$904_N$.

The ECS cluster 902 does not protect user data with traditional schemes like mirroring or parity protection. Instead, the ECS cluster 902 utilizes a k+m erasure coding protection scheme, wherein a data block (e.g., data chunk) is divided into k data fragments and m coding fragments are created (e.g., by encoding the k data fragments). Encoding is performed in a manner such that the ECS cluster 902 can tolerate the loss of any m fragments. As an example, the default scheme for ECS is 12+4, i.e. k equals to 12 and m equals to 4; however, the subject disclosure is not limited to this erasure coding protection scheme. When some fragments are lost, the missing fragments are restored via a decoding operation.

In one aspect, the storage services $908_1$-$908_N$ can handles data availability and protection against data corruption, hardware failures, and/or data center disasters. As an example, the storage services $908_1$-$908_N$ can comprise an unstructured storage engine (USE) (not shown), which is a distributed shared service that runs on each node $904_1$-$904_N$, and manages transactions and persists data to nodes. The USE enables global namespace management across geographically dispersed data centers through geo-replication. In an aspect, the USE can write all object-related data (such as, user data, metadata, object location data) to logical containers of contiguous disk space known as chunks. Chunks are open and accepting writes, or closed and not accepting writes. After chunks are closed, the USE can erasure-code them. The USE can write to chunks in an append-only pattern so that existing data is never overwritten or modified. This strategy improves performance because locking and cache validation is not required for I/O operations. All nodes $904_1$-$904_N$ can process write requests for the same object simultaneously while writing to different chunks.

ECS continuously monitors the health of the nodes $904_1$-$904_N$, their disks, and objects stored in the cluster. Smediaince ECS disperses data protection responsibilities across the cluster, it can automatically re-protect at-risk objects when nodes or disks fail. When there is a failure of a node or drive in the site, the USE can identify the chunks and/or erasure coded fragments affected by the failure and can write copies of the affected chunks and/or erasure coded fragments to good nodes and disks that do not currently have copies.

Private and hybrid clouds greatly interest customers, who are facing ever-increasing amounts of data and storage costs, particularly in the public cloud space. ECS provides a scale-out and geo-distributed architecture that delivers an on-premise cloud platform that scales to exabytes of data with a TCO (Total Cost of Ownership) that's significantly less than public cloud storage. Further, ECS provides versatility, hyper-scalability, powerful features, and use of low-cost industry standard hardware.

Figure 10:
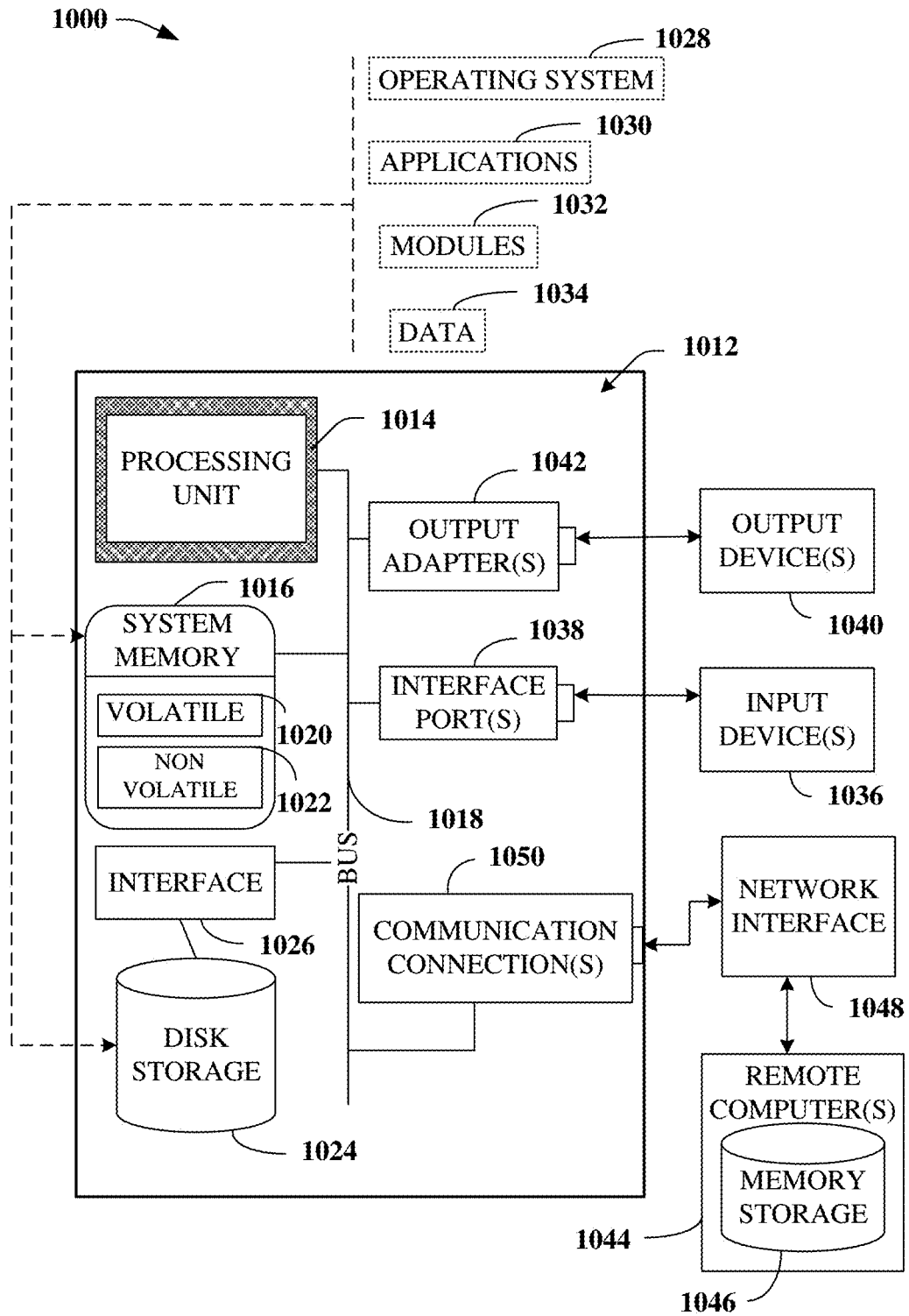
FIG. 10 illustrates a block diagram of an example computer operable to execute the disclosed distributed storage system architecture.

Referring now to FIG. 10, there is illustrated a block diagram of an example computer operable to execute data deletion with distributed erasure coding. In order to provide additional context for various aspects of the disclosed subject matter, FIG. 10 and the following discussion are intended to provide a brief, general description of a suitable computing environment 1000 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, (e.g., a carrier wave or other transport mechanism), and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that various embodiments disclosed herein can be implemented in combination with other program modules. Generally, program modules comprise routines, programs, components, data structures, etc. that perform particular tasks and/or implement particular abstract data types.

Moreover, those skilled in the art will appreciate that the inventive systems can be practiced with other computer system configurations, comprising single-processor or multiprocessor computer systems, computing devices, minicomputing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communication network; however, some if not all aspects of the subject disclosure can be practiced on stand-alone computers. In a distributed computing environment, program modules can be located in both local and remote memory storage devices.

With reference to FIG. 10, a block diagram of a computing system 1000 operable to execute the disclosed systems and methods is illustrated, in accordance with an embodiment. Computer 1012 comprises a processing unit 1014, a system memory 1016, and a system bus 1018. As an example, the component(s), server(s), node(s), cluster(s), system(s), zone(s), module(s), agent(s), engine(s), and/or device(s) disclosed herein with respect to systems 100-600 and 900 can each include at least a portion of the computing system 1000. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1016 comprises volatile memory 1020 and nonvolatile memory 1022. A basic input/output system (BIOS), comprising routines to transfer information between elements within computer 1012, such as during start-up, can be stored in nonvolatile memory 1022. By way of illustration, and not limitation, nonvolatile memory 1022 can comprise ROM, PROM, EPROM, EEPROM, or flash memory. Volatile memory 1020 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1012 also comprises removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, Jaz drive, Zip drive, LS-100 drive, flash memory card, or memory stick. In addition, disk storage 1024 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to system bus 1018, a removable or non-removable interface is typically used, such as interface 1026.

It is to be appreciated that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user can enter commands or information into computer 1012 through input device(s) 1036. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1014 through system bus 1018 via interface port(s) 1038. Interface port(s) 1038 comprise, for example, a serial port, a parallel port, a game port, a universal serial bus (USB), a wireless based port, e.g., Wi-Fi, Bluetooth®, etc. Output device(s) 1040 use some of the same type of ports as input device(s) 1036.

Thus, for example, a USB port can be used to provide input to computer 1012 and to output information from computer 1012 to an output device 1040. Output adapter 1042 is provided to illustrate that there are some output devices 1040, like display devices, light projection devices, monitors, speakers, and printers, among other output devices 1040, which use special adapters. Output adapters 1042 comprise, by way of illustration and not limitation, video and sound devices, cards, etc. that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, a workstation, a microprocessor based appliance, a peer device, or other common network node and the like, and typically comprises many or all of the elements described relative to computer 1012.

For purposes of brevity, only a memory storage device 1046 is illustrated with remote computer(s) 1044. Remote computer(s) 1044 is logically connected to computer 1012 through a network interface 1048 and then physically and/or wirelessly connected via communication connection 1050. Network interface 1048 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and DSL modems, wireless modems, ISDN adapters, and Ethernet cards.

The computer 1012 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1012 can connect to other devices/networks by way of antenna, port, network interface adaptor, wireless access point, modem, and/or the like.

The computer 1012 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth® wireless technologies. Thus, the communication can be a predefined structure as with a conventional network or simply an ad hoc communication between at least two devices.

The computing system 1000 is operable to communicate with any wireless devices or entities operatively disposed in wireless communication, e.g., desktop and/or portable computer, server, communications satellite, etc. This includes at least WiFi and Bluetooth® wireless technologies. Thus, the communication can be a predefined structure as with a conventional network or simply an ad hoc communication between at least two devices.

WiFi, or Wireless Fidelity, allows connection to the Internet from a couch at home, a bed in a hotel room, or a conference room at work, without wires. WiFi is a wireless technology similar to that used in a cell phone that enables such devices, e.g., computers, to send and receive data indoors and out; anywhere within the range of a base station. WiFi networks use radio technologies called IEEE 802.11 (a, b, g, n, etc.) to provide secure, reliable, fast wireless connectivity. A WiFi network can be used to connect computers to each other, to the Internet, and to wired networks (which use IEEE 802.3 or Ethernet). WiFi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used to dynamically perform operations as described herein.

A classifier can be a function that maps an input attribute vector, x=(x1, x2, x3, x4, xn), to a confidence that the input belongs to a class, that is, f(x)=confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
 a processor; and
 a memory that stores executable instructions that, when executed by the processor, facilitate performance of operations, comprising:
  determining a coding matrix that is to be employed to erasure code a chunk stored within a distributed storage system;
  determining non-intersecting sub matrices of the coding matrix; and
  encoding data fragments of the chunk by utilizing the non-intersecting sub matrices, wherein the encoding results in a generation of different coding fragments that are to be stored within respective zones of the distributed storage system.

2. The system of claim 1, wherein the operations further comprise:

in response to determining that a failure condition is satisfied, collecting available fragments from the respective zones.

3. The system of claim 2, wherein the operations further comprise:
decoding the available fragments based on a decoding matrix that corresponds to the coding matrix, and wherein the decoding results in a recovery of the data fragments.

4. The system of claim 3, wherein the operations further comprise:
subsequent to the decoding, re-encoding the data fragments based on the non-intersecting sub matrices.

5. The system of claim 2, wherein the determining that the failure condition is satisfied comprises determining that the data fragments are unable to be recovered at a zone level without inter-zone communication.

6. The system of claim 1, wherein the determining the coding matrix comprises determining the coding matrix based on a number of zones within the distributed storage system.

7. The system of claim 1, wherein the determining the coding matrix comprises determining the coding matrix based on an erasure coding protection protocol utilized at a zone level.

8. The system of claim 1, wherein the operations further comprise:
facilitating a storage of copies of the data fragments within the respective zones.

9. The system of claim 1, wherein the determining the non-intersecting sub matrices comprises splitting the coding matrix based on a number of the respective zones to which the chunk is to be replicated.

10. The system of claim 1, wherein the distributed storage system comprises a distributed object storage system.

11. A method, comprising:
configuring, by a system comprising a processor, a coding matrix that is to be employed during an erasure coding of a chunk stored within a distributed storage system;
determining first coding fragments based on encoding data fragments of the chunk in accordance with a first sub matrix of the coding matrix, wherein the first coding fragments are to be stored within a first zone of the distributed storage system; and
determining second coding fragments based on encoding the data fragments in accordance with a second sub matrix of the coding matrix, wherein the first sub matrix and the second sub matrix are non-intersecting matrices, and wherein the second coding fragments are to be stored within a second zone of the distributed storage system.

12. The method of claim 11, further comprising:
facilitating a storage of a first copy of data fragments within the first zone and a second copy of data fragments within the second zone.

13. The method of claim 12, further comprising:
determining that a multi-zone failure has occurred resulting in a loss of information stored within the first zone and the second zone; and
in response to determining that the multi-zone failure satisfies a defined failure criterion, facilitating a transfer of available fragments from the second zone to the first zone.

14. The method of claim 13, further comprising:
decoding the available fragments based on a decoding matrix that corresponds to the coding matrix, wherein the decoding results in a recovery of the data fragments.

15. The method of claim 11, wherein the configuring comprises configuring a size of the coding matrix based on a number of zones within the distributed storage system.

16. The method of claim 11, wherein the configuring comprises configuring a size of the coding matrix based on an erasure coding protection scheme utilized for data protection at a zone level.

17. A non-transitory computer-readable storage medium comprising instructions that, in response to execution, cause a server device comprising a processor to perform operations, comprising:
configuring a coding matrix that is to be employed to erasure code a chunk stored within a distributed storage system;
encoding data fragments of the chunk in accordance with a first sub matrix of the coding matrix to generate first coding fragments that are to be stored within a first zone of the distributed storage system; and
encoding the data fragments in accordance with a second sub matrix of the coding matrix to generate second coding fragments that are to be stored within a second zone of the distributed storage system, wherein the first sub matrix and the second sub matrix are non-intersecting matrices.

18. The non-transitory computer-readable storage medium of claim 17, wherein the operations further comprise:
storing a first copy of the data fragments with the first coding fragments within the first zone; and
storing a second copy of the data fragments with the second coding fragments within the second zone.

19. The non-transitory computer-readable storage medium of claim 18, wherein fragments comprise the first copy of the data fragments, the second copy of the data fragments, the first coding fragments and the second coding fragments, and wherein the operations further comprise:
in response to determining that at least a portion of the fragments is unavailable, decoding a remaining portion of the fragments other than the at least the portion that is unavailable in accordance with a decoding matrix that corresponds to the coding matrix to recover the data fragments.

20. The non-transitory computer-readable storage medium of claim 17, wherein the distributed storage system comprises a distributed object storage system.

* * * * *